United States Patent [19]

Suzuki et al.

[11] Patent Number: 4,803,145

[45] Date of Patent: Feb. 7, 1989

[54] LIGHT SENSITIVE ALKALI DEVELOPABLE PHOTORESIST MATERIAL WITH FLUORINE SURFACTANT CONTAINING COLOR LAYER

[75] Inventors: Tamotsu Suzuki; Fumiaki Shinozaki; Akira Nishioka; Mikio Totsuka, all of Shizuoka, Japan

[73] Assignee: Fuji Photo Film Co., Ltd., Kanagawa, Japan

[21] Appl. No.: 31,737

[22] Filed: Mar. 30, 1987

[30] Foreign Application Priority Data

Mar. 28, 1986 [JP] Japan ................................ 61-70019

[51] Int. Cl.$^4$ ...................... G03C 1/74; G03C 1/54; G03C 1/68
[52] U.S. Cl. ................................... 430/166; 430/160; 430/167; 430/271
[58] Field of Search ............... 430/166, 167, 160, 271

[56] References Cited

U.S. PATENT DOCUMENTS

| | | | |
|---|---|---|---|
| 3,787,351 | 1/1974 | Olson | 523/453 |
| 3,944,527 | 3/1976 | McCown | 428/264 |
| 3,995,085 | 11/1976 | McCown | 428/264 |
| 4,123,272 | 10/1978 | Quinn | 430/329 |
| 4,217,407 | 8/1980 | Watanabe et al. | 430/166 |
| 4,229,517 | 10/1980 | Bratt et al. | 430/281 |
| 4,311,784 | 1/1982 | Fan | 430/166 |
| 4,472,494 | 9/1984 | Hallman et al. | 430/160 |
| 4,504,566 | 3/1985 | Dueber | 430/166 |

FOREIGN PATENT DOCUMENTS 2023858  1/1980  Japan .................................. 430/192

OTHER PUBLICATIONS

M. L. Jarvis, W. A. Zisman, Encyclopedia of Chemical Technology, 2nd Ed., vol. 9, Interscience Publication, (1966), pp. 707-738.

*Primary Examiner*—Charles L. Bowers, Jr.
*Attorney, Agent, or Firm*—Sughrue, Mion, Zinn, Macpeak & Seas

[57] ABSTRACT

A light-sensitive image-forming material which has on a support a coloring layer comprising a coloring agent and an alkali soluble organic macromolecular binder, and a photopolymer layer, in the order listed, with the coloring layer further containing a particular fluorine-containing surface active agent, whereby uniform film thickness is ensured to the coloring layer even when drying is carried out in a short time using simple equipment. The fluorine-containing surface active agent is a copolymer comprising as repeating units (1) an acrylate or a methacrylate which has a fluorinated aliphatic group containing from 3 to 20 carbon atoms and not less than 40 wt % of fluorine atoms, with the aliphatic group having a terminal moiety containing at least 3 fluorinated carbon atoms, and (2) a poly(oxyalkylene)acrylate or a poly(oxyalkylene)methacrylate. In addition, the portion of the fluorinated aliphatic group-containing acrylate or methacrylate repeating unit is from 10 to 70% by weight.

8 Claims, No Drawings

LIGHT SENSITIVE ALKALI DEVELOPABLE PHOTORESIST MATERIAL WITH FLUORINE SURFACTANT CONTAINING COLOR LAYER

FIELD OF THE INVENTION

The present invention relates to an image-forming material which contains a fluorine-containing surface active agent, and more particularly, to an image-forming material having an even film thickness.

BACKGROUND OF THE INVENTION

An image-forming material has a layer comprising a photopolymer. In general, a photopolymer changes its molecular structure by irradiation with light to increase or decrease its solubility in a kind of solvent to an appreciable extent. By taking advantage of this phenomenon, images can be formed in the photopolymer layer. Therefore, image-forming materials of such a kind are employed depending on the end-use purpose as printing plates, such as a presensitized plate, a resin relief plate, etc., photoresists such as dry film resist, a prepress color proof, a contact lithographic film, and so on in a wide field which requires visible images, covering from general photography to graphic arts and/or photomechanical processes.

For instance, when it is used for forming a colored image, the image-forming material has a construction such as to have on a support, in sequence, a coloring layer containing a coloring agent and a binder, and a photopolymer layer.

A coloring layer is obtained by coating a coloring matter dissolved or dispersed in an organic solvent on a support whose surface has been subjected to a surface treatment, and/or covered with a subbing layer, and drying the coating. In the coating and drying steps, it is essential by all means to make the coloring layer uniform in order to fully achieve properties of the image-forming material.

However, it has so far been very difficult to obtain a uniform colored layer in the drying step. This is because the drying has hitherto been carried out by blowing temperature- and humidity-regulated air against the colored matter coated on the support to evaporate the solvent, and the air stream and/or any disorder of the temperature- and humidity-regulated air used therein cause unevenness in the thickness distribution of the dried coloring layer.

Unevenness of the film thickness of the coloring layer causes not only a bad impression in appearance, but also non uniformity of density at the stages of exposure and development, and a lowering of reproducibility of an original image.

In order to prevent the unevenness, gentle drying is required. For instance, one method which has been carried out for this purpose involves blowing dried air against the coated layer at a very low speed taking a great deal of time in drying it up; another method involves letting drying air have a temperature gradient, that is to say, letting the drying air have a low temperature at the initial stage of drying and letting it have a high temperature at the latter stage; and a third method involves adding a solvent having a high boiling point to the solvent in which the coloring composition is dissolved or dispersed. However, even using such methods, it is difficult to prevent completely an uneven distribution of the film thickness from occurring due to the drying air. In addition, since a belt-shaped support is made to travel and thereon, a coloring composition is continuously coated and dried in the case of producing a image-forming material industrially, such methods necessitate huge and complicated drying equipment. Further, a selection of solvent required in those methods imposes great restrictions on selection of ingredients themselves to constitute the coloring layer.

SUMMARY OF THE INVENTION

Therefore, an object of the present invention is to provide an image-forming material having a uniform film thickness through drying a coloring composition coated on a support.

Another object of the present invention is to provide an image-forming material having a uniform film thickness and an even density distribution by drying in a short time a coloring composition coated on a support.

A further object of the present invention is to provide an image-forming material having a uniform film thickness by drying a coloring composition coated on a support using a simple equipment.

As a result of intensive investigations to solve the above-described problems, it has been found that in producing an image-forming material, the problem of making the film tiickness non-uniform and the density distribution uneven, which has been caused in the drying step, has been overcome by incorporating a fluorine-containing surface active agent into a composition for a coloring layer to be coated.

In particular, the present invention can fully achieve its effect in an image-forming material of the kind which is produced by coating and drying continuously on a moving belt-shaped support a coloring layer composition dissolved or dispersed in an organic solvent.

That is, the present invention is directed to a light-sensitive image-forming material comprising a support having provided thereon a coloring layer which contains a coloring agent and an alkali-soluble organic macromolecular binder, and a photopolymer layer, in the order listed, wherein said coloring layer further contains a fluorine-containing surface active agent which is a copolymer comprising as repeating units (1) an acrylate or a methacrylate having a fluorinated aliphatic group containing 3 to 20 carbon atoms and not less than 40 wt % of fluorine atoms, whose terminal part contains at least 3 fluorinated carbon atoms, and (2) a poly(oxyalkylene)acrylate or a poly(oxyalkylene)-methacrylate, with the fluorinated aliphatic group-containing acrylate or methacrylate repeating unit constituting from 10 to 70 wt % based on said copolymer.

DETAILED DESCRIPTION OF THE INVENTION

The fluorinated aliphatic group (abbreviated as an Rf group hereinafter) is a saturated, and, in general, monovalent aliphatic group. It may take a form of straight chain or branched chain, and further a cyclic form or a composite form thereof (e.g., an alkylated alicyclic group) when it is sufficiently large in size. A carbon chain skeleton of the fluorinated aliphatic group can contain an oxygen and/or trivalent nitrogen atom attached to only chain carbon atoms. Such hetero atoms can contribute to stabilizing the linkage between or among fluorinated aliphatic moieties, and do not interfere with the inert characteristic of the Rf group. In order to produce sufficient effects, the Rf group contains from 3 to 20 carbon atoms, preferably from 6 to 12 carbon atoms, and not less than 40 wt %, preferably not less than 50 wt %, of carbon atom-attached fluorine atoms. In addition, at least 3 carbon atoms located at a terminal moiety of the Rf group are fluorinated. For example, the terminal moiety is $CF_3CF_2CF_2$—, and in essence the Rf group is perfectly fluorinated alkyl group like $C_nF_{2n+1}$— (n: an integer of 3 or more), or a fully fluorinated alkyl group.

When the fluorine content in the Rf group is less than 40 wt %, the objects of the present invention are not fully achieved. Greater effects are obtained by localizing the fluorine atoms in the end moiety portion of the Rf group. Although the fluorine content can be raised in the fluorinated aliphatic group containing 1 to 2 carbon atoms, the total weight of the fluorine atoms therein is relatively low, so the effects of such groups are weak. Further, even if the fluorine content in the copolymer is increased by raising the fraction of repeating units containing fully fluorinated aliphatic group having from 1 to 2 carbon atoms in the copolymer, sufficient effects cannot be produced because of delocalization of the fluorine atoms.

On the other hand, when the number of carbon atoms contained in the Rf group is 21 or more, a high fluorine content causes lowering of solubilities of the resulting copolymer in organic solvents, whereas a low fluorine content brings about insufficient localization of fluorine atoms in the resulting copolymer. Therefore, satisfactory results also cannot be obtained in such cases.

A soluble part of the copolymer is a poly(oxyalkylene) group, $(OR')_x$. A preferred R' includes alkylene groups having from 2 to 4 carbon atoms, such as —$CH_2CH_2$—, —$CH_2CH_2$—$CH_2$—, $CH(CH_3)CH_2$—, or —$CH(CH_3)CH(CH_3)$—. Oxyalkylene units in the poly(oxyalkylene) group may be the same as in poly(oxypropylene) group, or two or more of different oxyalkylene units may be irregularly distributed in the poly(oxyalkylene) group. More specifically, the poly(oxyalkylene) group may be made up of straight or branched chain oxypropylene units alone or oxyethylene units alone, or straight or branched chain oxypropylene units and oxyethylene units may be present in alternate blocks. These poly(oxyalkylene) chains may be mediated or contain one or more of a linkage group (e.g.,

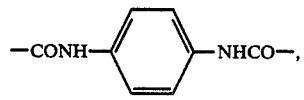

—S—, etc.). Linkage groups having three or higher valences afford a means of forming branched chain oxyalkylene units. In order to achieve a desired solubility in adding the copolymer to the colored composition, it is appropriate for the poly(oxyalkylene) group to have a molecular weight of 250 to 2,500.

The above-described copolymer to be used in the present invention can be produced by free radical-initiated copolymerization of, e.g., a fluorinated aliphatic group-containing acrylate or methacrylate with a poly(oxyalkylene)acrylate or a poly(oxyalkylene)methacrylate, more specifically the monoacrylate, the diacrylate or the mixture thereof. A molecular weight of the polyacrylate oligomer can be adjusted to a desired value by controlling a concentration and an activity of the initiator used, concentrations of the monomers used and a polymerization temperature, and by adding a chain transfer agent, e.g., a thiol like n-octylmercaptane. For instance, the copolymer having the following constitutional repeating units can be obtained by copolymerizing a fluorinated aliphatic group-containing acrylate Rf-R"—$O_2C$—CH=$CH_2$ (wherein R" represents, e.g., a sulfonamidoalkylene, a carbonamidoalkylene, or an alkylene), e.g., $C_8F_{17}SO_2N(C_4H_9)CH_2CH_2O_2CCH$=CH, and a poly(oxyalkylene)momoacrylate $CH_2$=CHC(O)(OR')$_x$OCH$_3$:

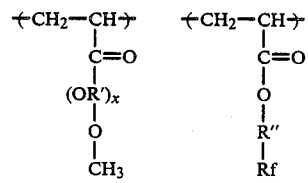

The foregoing fluorinated aliphatic group-containing acrylates are described in U.S. Pat. Nos. 2,803,615, 2,642,416, 2,826,564, 3,102,103, 3,282,905 and 3,304,278. Poly(oxyalkylene)acrylates to be used for producing the foregoing copolymers, and other acrylates useful for this purpose can be produced by allowing a commercially produced hydroxypoly(oxyalkylene) materials, e.g., "Pluronic", trademark for product produced by Asahi Denka Kogyo K.K.; "Adeka Polyether", trademark for product produced by Asahi Denka Kogyo K.K.; "Carbowax", trademark for product produced by Glyco Products Co.; "Toriton", trademark for product produced by Rohm and Haas Co., and "P.E.G.", trademark for product produced by Dai-Ichi Kogyo Seiyaku Co., Ltd., to react with acrylic acid, methacrylic acid, acryl chloride or acrylic anhydride in a conventional manner. Still other polyacrylate copolymers having the following constitutional repeating units can be produced by copolymerizing poly(oxyalkylene)diacrylates prepared in known manners, which are represented by the general formula $CH_2$=$CHCO_2(R'O)_xCOCH$=$CH_2$, specifically $CH_2$=$CHCO_2(C_2H_4)_{10}(C_3H_6O)_{22}(C_2H_4O)_{10}OCOCH$=$CH_2$, and the foregoing fluorinated aliphatic group-contained acrylates:

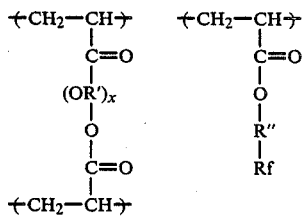

(wherein X represents an integer of from 1 to 55).

Other ethylenically unsaturated monomers containing a fluorinated aliphatic group in their terminal part, which are suitable for production of the copolymers to be used in the present invention are described in U.S. Pat. Nos. 2,592,069, 2,995,542, 3,078,245, 3,081,274, 3,291,843 and 3,325,163, and ethylenically unsaturated materials suitable for production of the above-described ethylenically unsaturated monomers having a terminal fluorinated aliphatic group are described in U.S. Pat. No. 3,574,791.

The copolymer to be used in the present invention, which is a copolymer of a fluorinated aliphatic group-containing acrylate or methacrylate, and a poly(oxyalkylene)acrylate or -methacrylate, contains the fluorinated aliphatic group-containing repeating unit in a fraction of 10 to 70 wt % based on the weight of the oligomer. When a fraction of the fluorinated aliphatic group-containing monomer unit is less than 10 wt %, sufficient effects cannot be produced, whereas when it is more than 70 wt %, the solubilities of the resulting copolymer in solvents are too low. A suitable molecular weight of the copolymer of the present invention ranges from 2,500 to 100,000. Sufficient effects cannot be achieved by the molecular weights less than 2,500, and molecular weights more than 100,000 are undesirable because of low solubilities in solvents.

In the copolymers used preferably in the present invention, a fluorinated aliphatic group-containing acrylate is contained in a proportion of from 50 to 100 wt % with respect to the total fluorinated aliphatic group-containing repeating units, and the poly(oxyalkylene)acrylate repeating units are contained in a proportion of 15 wt % or more with respect to the total copolymer. Particularly preferred ones are copolymers produced from fluorinated aliphatic group-containing acrylates and poly(oxyalkylene)acrylates. When fluorinated aliphatic group-contained methacrylates amount to 50 wt % or more of the whole fluorinated aliphatic group-contained monomer units, solubilities of the resulting copolymers in solvents are lowered. On the other hand, when the poly(oxyalkylene)acrylate monomer constitutes less than 15 wt % of the copolymer, pinholes tend to be generated in the coated film.

Specific examples of fluorine-containing surface active agents which can be employed in the present invention include copolymers produced by copolymerizing fluorine containing monomers represented by formula (I) and monomers represented by formula (II) which constitute the soluble part of the resulting copolymer:

$$\begin{array}{c}R_1 \\ R_2\end{array}\!\!\!C\!=\!C\!\!\!\begin{array}{c}R_3 \\ COO(CH_2)_a N\!-\!SO_2\!-\!C_nF_{2n+1} \\ | \\ R_4\end{array} \quad (I)$$

wherein $R_1$, $R_2$, $R_3$ and $R_4$ each represents a hydrogen atom, or an alkyl group containing from 1 to 12 carbon atoms; a represents an integer of from 1 to 5; and n represents an integer of from 6 to 12

$$\begin{array}{c}R_5 \\ R_6\end{array}\!\!\!C\!=\!C\!\!\!\begin{array}{c}R_7 \\ COO(C_2H_4)_b(C_3H_6O)_c(C_2H_4O)_dR_8\end{array} \quad (II)$$

wherein $R_5$, $R_6$, $R_7$ and $R_8$ each represents a hydrogen atom, or an alkyl group containing from 1 to 12 carbon atoms; b, c, and d each represents zero or an integer of 1 to 55, provided that the case of b=c=d=0 is excluded.

An example of processes for synthesizing the fluorine contained surface active agents is to be employed in the present invention is illustrated using the following reaction schemes:

(A) Synthesis of $CH_2=CH$
$\quad\quad\quad\quad\quad\quad\quad | $
$\quad\quad\quad\quad\quad\quad COOC_2H_4N\!-\!SO_2C_8F_{17}$
$\quad\quad\quad\quad\quad\quad\quad\quad\quad | $
$\quad\quad\quad\quad\quad\quad\quad\quad\quad C_3H_7$ (i) $C_8H_{17}SOCl \xrightarrow{HF} C_8H_{17}SO_2F$ (ii) $C_8F_{17}SO_2F + NH_2C_3H_7 \longrightarrow$ $\quad\quad C_8H_{17}SO_2NHC_3H_7 \xrightarrow{ClC_2H_4OH}$ $\quad\quad C_8H_{17}SO_2\!-\!N(CH_2)_2OH \xrightarrow{CH_2=CH-COCl}$
$\quad\quad\quad\quad\quad\quad\quad | $
$\quad\quad\quad\quad\quad\quad\quad C_3H_7$ $\quad\quad\quad\quad CH_2=CH\!-\!COO(CH_2)_2NSO_2C_8H_{17}$
$\quad\quad\quad\quad\quad\quad\quad\quad\quad\quad\quad\quad\quad\quad | $
$\quad\quad\quad\quad\quad\quad\quad\quad\quad\quad\quad\quad\quad\quad C_3H_7$ (B) Synthesis of

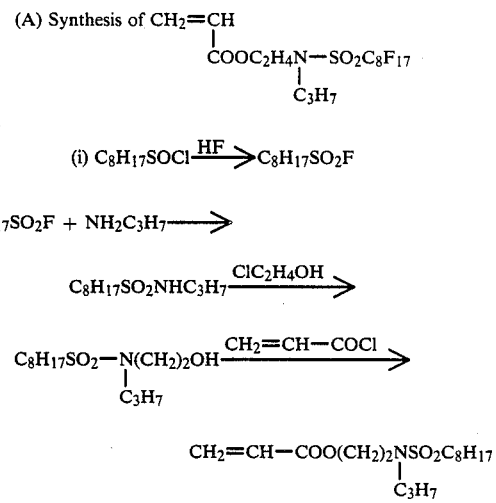

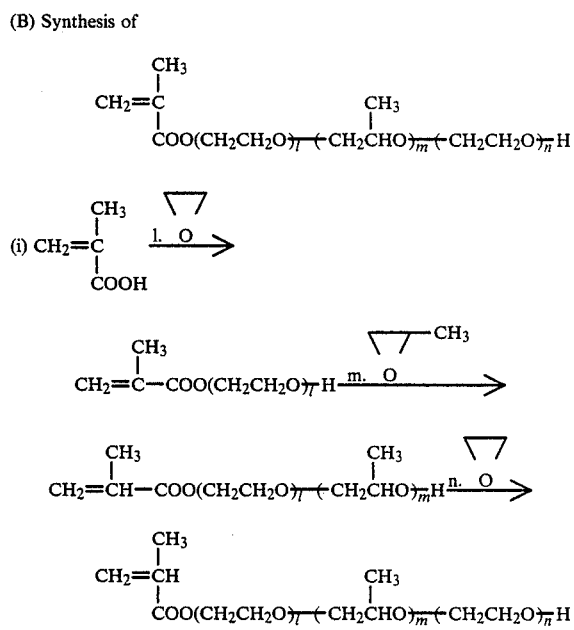

The fluorine-citnaining surface active agent according to the present invention can be synthesized by copolymerizing the monomer (A) and the monomer (A) and the monomer (B) in a known manner.

More specific examples of the fluorine-containing surface active agents include (1) 40/60 (by weight) Copolymer of $CH_2=CH$ and $CH_2=CH$
$\quad | \quad\quad\quad\quad\quad\quad\quad\quad\quad\quad\quad | $
$COO(CH_2)_2NSO_2C_8F_{17}\quad COO(C_2H_4O)_7CH_3$
$\quad\quad\quad | $
$\quad\quad\quad C_4H_9$ (molecular weight: 20,000)

(2) 60/40 (by weight) Copolymer of $CH_2=CH$ and $CH_2=CH$
$\quad | \quad\quad\quad\quad\quad\quad\quad\quad\quad\quad\quad | $
$COO(CH_2)_2NSO_2C_8F_{17}\quad COO(C_3H_6O)_7CH_3$
$\quad\quad\quad | $
$\quad\quad\quad C_4H_9$ (molecular weight: 5,000)

-continued (3) 30/70 (by weight) Copolymer of

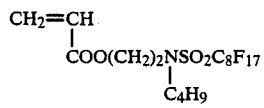
and

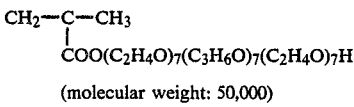

(molecular weight: 50,000)

and so on.

One or more of a subbing layer may be provided beneath the coloring layer comprising an alkali soluble organic macromolecular binder. As a material to constitute the subbing layer, at least one organic macromolecular substance selected from among polyolefins, such as polyethylene, polypropylene, etc.; ethylene copolymers, such as ethylene/vinyl acetate copolymer, ethylene/acrylate copolymer, etc.; polyvinyl chloride; vinyl chloride copolymers, such as vinyl chloride/vinyl acetate copolymer, etc.; polyvinylidene chloride; vinylidene chloride copolymers; polystyrene; styrene copolymers, such as styrene/maleate copolymer, etc.; poly(meth)acrylates; (meth)acrylate copolymers, such as (meth)acrylate/vinyl acetate copolymer, etc.; vinyl acetate copolymers; polyvinyl acetal resins; gelatin; denatured polyvinyl alcohols; polyamide resins, such as nylon, copolymerized nylons, N-alkoxymethylated nylons, etc.; synthetic rubbers; chlorinated rubbers; and cellulose derivatives can be used. As for the alkali-soluble organic macromolecular binder, the coloring agent and other additives, those described in U.S. Pat. No. 4,482,625 and Senryo Binran (which means Handbook of Dyes, and was published by Yuki Gosei Kagaku Kyokai in 1970), and so on can be employed.

Specific examples of macromolecular binders include styrene/maleic anhydride copolymer, polymethylmethacrylate, polyvinyl butyral, alcohol-soluble polyamides, polyvinyl acetate, maleate resins, terpenephenol resins, and mixtures of two or more thereof.

More detailed description of the present invention will be given below. However, the present invention should not be construed as being limited to the following description.

As for the support, dimensionally stable sheets including those that have been used as supports for plates in the graphic arts can be used to advantage in the present invention also. Specific examples of such supports include paper, paper laminated with a plastic film (e.g., polyethylene, polypropylene, polystyrene, etc.), sheets of metals such as aluminium including aluminium alloys, zinc, iron, copper, etc., plastic films such as cellulose diacetate film, cellulose triacetate film, cellulose propionate film, cellulose butyrate film, cellulose butyrate acetate film, cellulose nitrate film, polyethylene terephthalate film, polyethylene film, polystyrene film, polypropylene film, polycarbonate film, polyvinyl acetal film, etc., paper and a plastic film on which a metal as described above is evaporated or laminated, and so on.

The fluorine containing surface active agent of the present invention is used in an amount of, preferably from 0.01 to 12 wt %, more preferably from 0.05 to 5 wt %, based on the coloring layer constituents (excepting, of course, the solvent used).

The coloring layer constituents, including the fluorine-containing surface active agents, are dissolved or dispersed in a single solvent or a mixed solvent, specific examples of which are set forth below, coated on a support as described above, and dried. A preferred proportion of the coloring agent to the binder in the coloring layer ranges from 1 to 100 wt %, particularly from 5 to 50 wt %. A preferred thickness of the coloring layer is about from 0.1 to 10 μm.

Solvents having a boiling point of from 40° to 200° C., and particularly from 60° to 160° C., are chosen, because they have a great advantage in drying of the coloring layer.

Specific examples of solvents which can be used include water; alcohols, such as methyl alcohol, ethyl alcohol, n- or iso-propyl alcohol, n- or iso-butyl alcohol, etc.; ketones, such as acetone, methyl ethyl ketone, methyl propyl ketone, methyl butyl ketone, methyl amyl ketone, methyl hexyl ketone, diethyl ketone, diisobutyl ketone, cyclohexanone, methylcyclohexanone, etc.; hydrocarbons, such as benzene, toluene, xylene, cyclohexane, methoxybenzene, etc.; acetates, such as ethyl acetate, n- or iso-propyl acetate, n- or iso-butyl acetate, ethylbutyl acetate, hexyl acetate, etc.; halides, such as methylene dichloride, ethylene dichloride, monochlorobenzene, etc.; ethers, such as isopropyl ether, n-butyl ether, dioxane, dimethyldioxane, tetrahydrofuran, etc.; polyhydric alcohols and their derivatives, such as ethylene glycol, methyl cellosolve, methyl cellosolve acetate, ethyl cellosolve, diethyl cellosolve, cellosolve acetate, butyl cellosolve, butyl cellosolve acetate, methoxymethoxyethanol, diethylene glycol monomethyl ether, diethylene glycol methyl ethyl ether, diethylene glycol diethyl ether, propylene glycol, propylene glycol monomethyl ether, propylene glycol monomethyl ether acetate, propylene glycol monobutyl ether, etc.; and special solvents such as dimethyl sulfoxide, N,N-dimethylformamide, etc. These solvents may be used individually or as a mixture of two or more thereof. A solids content in the coating composition is preferably from 2 to 50 wt %.

Examples of usable coating methods include roll coating, dip coating, air knife coating, gravure coating, gravure offset coating, hopper coating, blade coating, wire doctor coating, spray coating, and so on. A preferred coverage of the coloring layer composition ranges from 10 to 100 ml/m².

Drying is carried out using heated air. It is appropriate to heat air up to a temperature ranging from about 30° C. to 200° C., and preferably from 40° C. to 160° C. A drying temperature may be maintained constant during drying, or may be raised stepwise.

In some cases, more desirable results are achieved by removing moisture from drying air. Heated air is preferably supplied onto the coated face at a speed of from 0.1 to 30 m/sec., and preferably from 0.5 to 20 m/sec.

In accordance with the present invention, the coloring layer is free from unevenness of film thickness, which has so far occurred in the drying step, and properties with which an image-forming material is to be furnished can be rendered uniform. Further, the present invention makes it feasible to coat a coloring layer having uniform thickness and density under very wide range of drying conditions, and to achieve simplification of drying equipment required.

A light-sensitive substance to be added to the photopolymer layer can be appropriately chosen from the materials described in Japanese Patent Application (OPI) No. 97140/84 (corresponding to U.S. Pat. No. 4,482,625) (the term "OPI" means an "unexamined published application"), *Color Materials*, Vol. 44, pp. 116-137 (1971), Takahiro Tsunoda, *Kankosei Jushi* (which means "photopolymers"), Insatsu Gakkai Shuppan-bu (1972), *Fundamentals and Applications of Photopolymer*, CMC Co. (1977), and so on.

Various kinds of materials can be used for forming a photoresist layer. It is preferable to use an alkali developable photoresist layer. As a specific example of such materials, mention may be made of a photopolymer composition containing o-quinoneazide as a sensitizer. Further, there are materials suitable for forming a negatively working photoresist layer, with specific examples including the composition obtained by blending an azide type sensitizer such as 2,6-di(4'-azidobenzal)cyclohexane and a phenol novolak resin, and a photopolymerization type light-sensitive composition obtained by blending a benzylmethacrylate/methacrylic acid (e.g., 7/3 by mole) copolymer as a binder, a polyfunctional monomer such as trimethylolpropane triacrylate, and a photo-initiator like Michler's ketone.

In addition, combinations of the compounds capable of producing acids by photolysis with various compounds, such as acetal or O,N-acetal compounds (described in Japanese Patent Application (OPI) No. 89003/73), orthoester or amidoacetal compounds (described in Japanese Patent Application (OPI) No. 120714/76), polymers having acetal or ketal linkages in their main chains (described in Japanese Patent Application (OPI) No. 133429/78), enol ether compounds (described in Japanese Patent Application (OPI) No. 12995/80), N-acyliminocarboxylic acid compounds (described in Japanese Patent Application (OPI) No. 126236/80), and polymers having orthoester linkages in their main chains (described in Japanese Patent Application (OPI) No. 17345/81 corresponding to U.S. Pat. No. 4,311/782) can be instanced. A suitable thickness of the photopolymer layer is within the range of from 0.1 to 3 $\mu$m, preferably from 0.5 to 1.5 $\mu$m.

Exposure is carried out imagewise using, e.g., an ultra-high pressure mercury lamp of 2 kw (e.g., Jet Light 2000, made by Oak Mfg. Co., Ltd.) placed at a distance of 50 cm, and development is carried out, e.g., at 32° C. using a developer having the following composition:

| Na$_2$CO$_3$ | 15 g |
|---|---|
| Butyl Cellosolve | 3 g |
| Distilled water | 1 liter |

The present invention will now be illustrated in greater detail by reference to the following examples and comparative examples. However, the invention should not be construed as being limited to the following examples. Additionally, in the following examples and comparative examples, all percentages are by weight unless otherwise indicated.

EXAMPLES 1 TO 9 AND COMPARATIVE EXAMPLES 1 TO 3

On a biaxially stretched polyethylene terephthalate film having a thickness of 50 $\mu$m and a width of 1 m, the following composition was coated so as to have a dry thickness of 1 $\mu$m, and dried at 100° C. for 1 minute to form a coloring layer. In the composition, a fluorine containing surface active agent synthesized by using the monomers set forth in Table 1 in the fractions shown in Table 1 was added.

| Coloring Layer Composition: | |
|---|---|
| Styrene/maleic anhydride (50/50) copolymer | 7 g |
| Cyanine Blue 4920 (products of Dainichiseika Colour & Chemical Mfg. Co., Ltd.) | 2 g |
| Fluorine containing surface active agent (set forth in Table 1) | 0.2 g |
| n-Propanol | 50 g |
| Acetone | 40 g |

On the coloring layer, a composition constituted with the following ingredients was coated and dried so as to have a dry thickness of 1.0 $\mu$m to form a photopolymer layer. Thus, an image-forming materials was obtained.

| Photopolymer Composition: | |
|---|---|
| 2-Diazo-1-naphthol-4-sulfonyl chloride adduct of condensate of acetone and propyrogallol (mean polymerization degree: 3) | 15 g |
| Novolak type phenol-formaldehyde resin (PR-50904, produced by Sumitomo Durez Co., Ltd.) | 30 g |
| Cyclohexane | 120 g |
| n-Propyl acetate | 280 g |

Unevenness of film thickness (coating unevenness) and non-uniformity of color density in the coloring layer of the thus obtained image-forming materials are judged visually, and thereby, a rank of A to D was given for evaluation. The ranks A to D for evaluating the extent of coating unevenness were as follows.

A: The coloring layer is uniform and free from coating unevenness, and is suitable for practical use.

B: The coloring layer has a little coating unevenness, and is acceptable for practical use.

C: The coloring layer has substantial coating unevenness due to drying air, and is unacceptable for practical use.

D: The coloring layer has extreme coating unevenness, and is incapable of commercial use.

As a result of examining proportions of density differences between the dense area and the thin area with respect to coating unevenness corresponding to the ranks B to D, the proportion in the rank B was about 1%, that in the rank C was about 1 to 2%, and that in the rank D was about 3%.

The results obtained are shown in Table 1.

Moreover, as for the coating unevenness of such a kind as to make the coated layer thin in a form of pinhole (cissing), the number of pinholes generated per 1,000 m was examined, and the results are also shown in Table 1.

TABLE 1

| Sample No. | Constitutent monomers of fluorine-containing surface active agent (wt %) | | | | | Molecular weight of fluorine-containing surface active agent | State of coating unevenness in coloring layer | Number of pinhole-shaped cissing |
|---|---|---|---|---|---|---|---|---|
| | *I | *II | *III | *IV | *V | | | |
| Example 1 | 60 | 40 | — | — | — | 15,000 | A | 0 |
| Example 2 | 60 | — | — | 40 | — | " | A | 0 |
| Example 3 | 60 | 20 | — | 20 | — | " | A | 0 |
| Example 4 | 60 | 20 | 20 | — | — | " | A | 0 |
| Example 5 | 40 | 60 | — | — | — | " | B | 0 |
| Example 6 | 30 | 70 | — | — | — | " | B | 0 |
| Example 7 | 60 | — | — | — | 40 | " | A | 0 |
| Example 8 | 60 | 10 | 30 | — | — | " | A | 10 |
| Example 9 | 60 | — | 40 | — | — | " | A | 65 |
| Comparative Example 1 | 20 | 80 | — | — | — | " | C | 0 |
| Comparative Example 2 | 80 | 20 | — | — | — | " | C | 50 |
| Comparative Example 3 | — | — | — | — | — | — | D | 0 |

Note:
*I: N—butylperfluorooctanesulfonamidoethylacrylate [$C_8F_{17}SO_2N(C_4H_9)CH_2CH_2OCOCH=CH_2$]
*II: Poly(oxyalkylene)acrylate [$CH_3O(C_2H_4O)_7COCH=CH_2$]
*III: Poly(oxyalkylene)methacrylate [$CH_3O(C_2H_4O)_7COC(CH_3)=CH_2$]
*IV: Poly(oxyalkylene)acrylate [$CH_3O(C_3H_6O)_7COCH=CH_2$]
*V: Poly(oxyalkylene)acrylate [$CH_3O(C_2H_4O)_4(C_3H_6O)_6(C_2H_4O)_4COCH=CH_2$]

As can be seen from the results shown in Table 1, in Examples 1 to 9, coating unevenness was not observed at all, or even when it was observed, the extent thereof was slight enough for practical use. In contrast to the results obtained in Examples 1 to 9, the extent of coating unevenness in the Comparative Examples 1 to 3 was too great for practical use. On the other hand, cissing was generated by using the fluorine containing surface active agents of the invention in Examples 8 and 9. However, such was still within a practically usable level.

Separately, each of the image-forming materials was brought into contact with an original image, and exposed to an ultraviolet mercury lamp of 2 kw for 30 seconds. Thereafter, it was processed with the following developer to remove the unexposed part of the photopolymer layer. Thus, a colored image was formed. Then, reproducibility from the original image was examined by comparing the dot areas of the original image with those of the colored image obtained. As the result, the reproducibility was excellent in Examples 1 to 9, while it was poor in the Comparative Examples 1 to 3 because of the ununiformity of the color density in the colored images. Besides, the lowering of the sensitivity due to the addition of fluorine cntaining surface active agents was not observed at all in Examples 1 to 9.

Composition of Developer:
| | Na₂CO₃ | 15 g |
|---|---|---|
| | Butyl Cellosolve | 1 g |
| | Distilled water | 1 liter |

While the invention has been described in detail and with reference to specific embodiments thereof, it will be apparent to one skilled in the art that various changes and modifications can be made therein without departing from the spirit and scope thereof.

What is claimed is:

1. A light-sensitive image-forming material comprising a support having provided thereon a coloring layer having a thickness of about 0.1 to 10 μm comprising a coloring agent and an alkali soluble organic maromolecular binder, said coloring agent being present in an amount of from 1-100 wt % based on the weight of said binder, and an alkali developable photoresist layer, in the order listed, wherein said coloring layer further contains from 0.01 to 12 wt % based on coloring layer constituents (as solids) of a fluorine-containing surface active agent which isa copolymer comprising as repeating units (1) an acrylate or a methacryalte which has a fluorinated aliphatic group containing from 3 to 20 carbon atoms and not less than 40 wt % of fluorine atoms, said aliphatic group having a terminal moiety containing at least 3 fluorinated carbon atoms, adn (2) a poly(oxyalkylene) acrylate or a poly(oxyalkylene)methacrylate, wherein said fluorinated aliphatic group-containing acrylate or methacrylate repeating unit consititutes from 10 to 70 wt % based on said copolymer, and said copolymer has a molecular weight ranging from 2,500 to 100,000.

2. An image-forming material as in claim 1, wherein said copolymer contains as repeating units a fluorinated aliphatic group-containing aryalte and a poly(oxyalkylene)-acrylate.

3. An image-forming material as in claim 1, wherein said fhuorinated aliphatic group contains from 6 to 12 carbon atoms and not less than 50 wt % of flurine atoms.

4. An image-forming material as in claim 1, wherein fluorinated aliphatic group-containing acrylate is contained in a proportion of from 50 to 100 wt % with respect to the total fluorinated aliphatic group-containing repeating units, and poly(oxyalkylene)acrylate repeating units are contained in a proportion of 15 wt % or more with respect to the total copolymer.

5. An image-forming material as in claim 1, wherein the coloring layer is formed by coating a composition containing from 2 to 50 wt % solids in a range of from 10 to 100 ml/m².

6. An image-forming material as in claim 1, wherein said fluorine-containing surface active agent is used in an amount of from 0.01 to 12 wt % based on coloring layer constituents (as solids).

7. a light-sensitive image-forming material as in claim 1, wherein said alkali developable photoresist contains a photosensitive o-quinoediazide.

8. A light-sensitive image-forming material as in claim 1 wherein said coloring agent is present in an amount of 5 to 50 wt % based on said binder.

* * * * *